United States Patent [19]

Wittenzellner

[11] 3,742,257

[45] June 26, 1973

[54] MONOSTABLE MULTIVIBRATOR PULSE-FORMING CIRCUIT

[75] Inventor: Ernst Wittenzellner, Munich, Germany

[73] Assignee: Siemens Aktiengesellschaft, Berlin, Germany

[22] Filed: Apr. 19, 1971

[21] Appl. No.: 135,011

[30] Foreign Application Priority Data

Apr. 23, 1970 Germany.................. P 20 19 804.3

[52] U.S. Cl................... 307/273, 307/265, 307/293

[51] Int. Cl. .......................................... H03k 17/26

[58] Field of Search.................... 307/228, 273, 265, 307/293

[56] References Cited

UNITED STATES PATENTS

| | | | |
|---|---|---|---|
| 3,297,883 | 1/1967 | Schulmeyer et al. | 307/293 X |
| 3,484,624 | 12/1969 | Rasiel et al. | 307/265 |
| 3,582,687 | 6/1971 | Bellomo | 307/273 |
| 3,590,283 | 6/1971 | Carmody et al. | 307/273 |
| 3,569,842 | 3/1971 | Schroyer | 307/228 X |

*Primary Examiner*—Stanley D. Miller, Jr.
*Attorney*—Curt M. Avery, Arthur E. Wilfond, Herbert L. Lerner and Daniel J. Tick

[57] ABSTRACT

A noise-immune pulse-forming circuit which is a monostable multivibrator having a diode for dynamic feedback. A flip flop follows the diode. A timing circuit has a time-determining capacitor which has nearly no voltage across it in the quiescent state. The timing circuit resets the flip-flop via one input of a differential amplifier.

3 Claims, 1 Drawing Figure

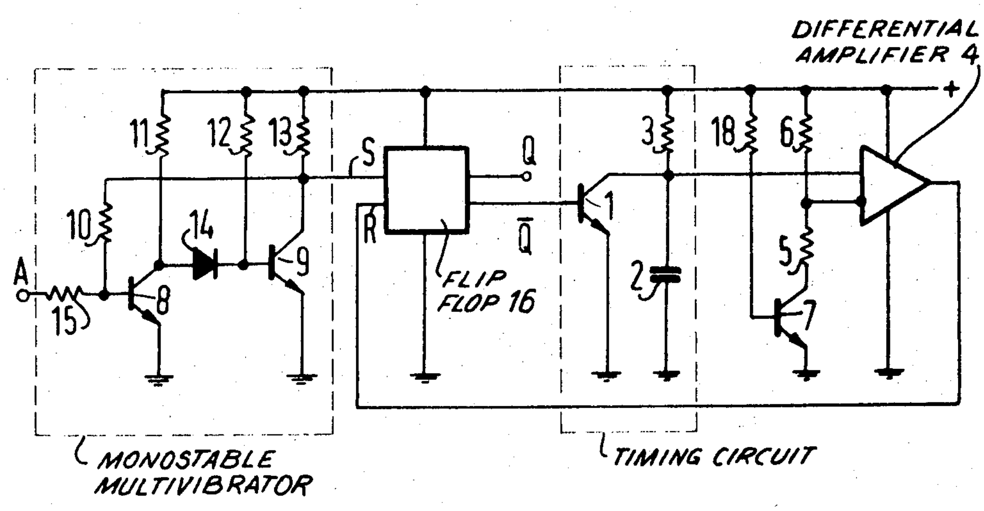
DIFFERENTIAL AMPLIFIER 4
A
15
10
11
12
13
14
8
9
S
R
Q
Q̄
FLIP FLOP 16
1
2
3
18
6
5
7
MONOSTABLE MULTIVIBRATOR
TIMING CIRCUIT

MONOSTABLE MULTIVIBRATOR PULSE-FORMING CIRCUIT

DESCRIPTION OF THE INVENTION

The invention relates to a monolithically integrable monostable multivibrator.

The integral monostable multivibrator of the invention is specifically applicable in digital technology. In digital technology, voltage pulses of defined duration are commonly generated by monostable multivibrators. In addition to the requirement that the duration of the pulse should be as independent as possible of fluctuations of the ambient temperature and the supply voltage, of manufacturing tolerances and the aging of the components used, it is required that a pulse can be released only by a trigger pulse at the input of the multivibrator, but not by noise spikes in the supply voltage.

Generally, such monostable multivibrators are designed according to the well-known principle of the monostable Eccles-Jordan circuit. While this circuit may be realized with a relatively small number of components, it has a decisive disadvantage. The basic circuit contains two feedback paths, a static one and a dynamic one. The dynamic feedback is accomplished via a capacitor which is connected to the supply voltage via a resistor. The pulse duration is determined by the RC circuit formed thereby. However, since in the quiescent state one side of the capacitor is at the supply potential, a small noise voltage jump on the supply voltage line is sufficient to release a full output pulse of the multivibrator. If, due to strong requirements as to the accuracy of the pulse duration, a sensitive differential amplifier is included in the basic circuit, noise of a few millivolts is sufficient to release an output pulse. This detrimental behavior of the circuit has until now been counteracted in an unsatisfactory manner, but not eliminated, by filtering the supply voltage or by Miller integration. A further disadvantage of the basic circuit of the monostable multivibrator is that polarized capacitors cannot be used because a charge reversal occurs with every pulse cycle. Such polarized capacitors are advantageous for extending the range over which the duration of the pulse can be varied.

The principal object of my invention is to provide a monolithically integrable monostable multivibrator which avoids the indicated shortcomings of known circuitry, that is, a multivibrator which is above all insensitive to noise spikes in the supply voltage.

An object of the invention is to provide a monostable multivibrator which has extremely high noise immunity.

Another object of the invention is to provide a monostable multivibrator which may utilize polarized capacitors and may therefore have a wider range for variation of the pulse duration.

Another object of the invention is to provide a monostable multivibrator in which the dead time is kept extremely short.

The multivibrator of my invention is distinguished from the prior art not only by extremely high noise immunity, but also has advantages which justify the inherently greater number of components which, however, plays a subordinate role in integrating, as long as the monolithic chip does not exceed a specific size. One such advantage, for instance, is that the capacitor of the time-determining RC circuit is on one side at the reference potential and is charged only in one direction. For this reason, polarized capacitors may also be used, and this results in a wider range for varying the pulse duration.

Another advantage of the multivibrator of the invention is that the capacitor of the time-determining RC circuit finds during its discharge essentially only the resistance of the emitter-collector path of the transistor of the timing circuit. This results in the so-called dead time, which is the time that must pass after the end of a pulse until a new release of an output pulse is possible, being kept extremely short.

To solve the problem of noise spikes in the supply voltage, I provide a monolithically integrable monostable multivibrator which, in accordance with my invention, is characterized by the fact that a bistable multivibrator or flip flop having two inputs and outputs, of which one is always the input or output, respectively, of the monostable multivibrator, is followed at the second output by a timing circuit which is connected to the second input of the flip flop via a differential amplifier. The timing circuit preferably comprises a transistor and an RC circuit. The base electrode of the transistor is connected to the second output of the flip flop. The output signal at the second output signal of the flip flop is inverted with respect to the output signal of the multivibrator. The emitter electrode of the transistor is at reference or ground potential, and its collector electrode is connected to one input of the differential amplifier. The collector electrode is also connected via the resistor of the RC circuit to the supply voltage, and via the capacitor of the RC circuit to the reference potential. A second input of the differential amplifier is connected to the tap point of a resistive or ohmic voltage divider connected between the supply voltage and the reference potential.

The noise immunity is achieved by the fact that the capacitor of the time-determining RC circuit is short-circuited in the quiescent state by the conducting transistor of the timing circuit and is practically at reference potential at both its terminals. The first input of the differential amplifier is therefore also at reference potential, that is, far below the cut-off point, since a relatively high voltage is applied to the second input via the resistive or ohmic voltage divider and the differential amplifier responds only if both input voltages are equal. Noise spikes in the supply voltage therefore have no effect and will not make the differential amplifier respond.

In another advantageous embodiment of the invention, the voltage which remains at the first input of the differential amplifier is compensated, via the second input of the differential amplifier, with respect to the reference potential, because the transistor of the timing circuit exhibits a residual voltage in the collector-emitter path even in the conducting condition. This is accomplished by "raising" the base point of the resistive or ohmic voltage divider to the tap point to which the second input of the differential amplifier is connected via another transistor. The additional transistor is identical to the transistor of the timing circuit in structure and manufacture. The emitter electrode of the additional transistor is at reference potential, its collector electrode is at the base point of the resistive voltage divider, and its base electrode is at the supply voltage via an ohmic resistor. Since this transistor is conducting in any event, the two inputs of the differential amplifier are essentially raised by the same residual voltage in the quiescent state of the multivibrator.

In still another advantageous embodiment of my invention, the circuit is connected in series with a noise-immune pulse-forming circuit. A monostable multivibrator is connected between the first input of the flip flop and the input proper of the overall monostable multivibrator circuit. The monostable multivibrator is designed in accordance with the principle of the Eccles-Jordan circuit. The noise immunity of the monostable multivibrator is achieved by providing the dynamic feedback between the collector electrode of a first transistor and the base electrode of a second transistor, not, as in the known case, by a capacitor, but by a diode. In the quiescent state, the diode is conducting. Interference due to voltage spikes in the supply voltage is therefore ineffective. The diode is cut off and functions as a capacitance, only when the monostable multivibrator is triggered. The capacitance of the diode cannot be made arbitrarily large, but a very short pulse is sufficient to trigger the flip flop. Furthermore, the objective of a series-connected pulse-forming circuit is not in determining the time, but merely in pulse-forming.

In order that the invention may be readily carried into effect, it will now be described with reference to the accompanying drawing, wherein the single Figure is a circuit diagram of an embodiment of the monostable multivibrator of the invention.

In the Figure, a flip flop 16 has a set input S, a reset input R, a set output Q and a reset output Q. The flip flop 16 is a so-called RS flip flop. The flip flop 16 is "set" via the set input S and "reset" via the reset input R. The output Q provides the output signal of the monostable multivibrator. The output Q provides a signal which is inverted with respect to the signal provided by the output Q. A timing circuit is connected to the output Q.

The timing circuit comprises a transistor 1, a capacitor 2 and an ohmic resistor 3. The base electrode of the transistor 1 is connected to the output Q. The emitter electrode of the transistor 1 is connected to the reference or ground potential. The capacitor 2 is connected on one side to the reference or ground potential and on the other side to the positive polarity terminal of the supply voltage via an ohmic resistor 3. The collector electrode of the transistor 1 is connected to a common point in the connection between the capacitor 2 and the resistor 3.

A differential amplifier 4 having two inputs is connected to the timing circuit in such a manner that the collector electrode of the transistor 1 is connected to one input of such differential amplifier. The other input of the differential amplifier 4 is connected to the junction point of an ohmic or resistive voltage divider having resistors 5 and 6. One end of the voltage divider 5, 6 connected to the positive polarity terminal of the supply voltage and is at supply voltage potential. The other end of the voltage divider 5, 6 at its base point, is connected to the reference or ground potential via the collector-emitter path of a transistor 7. The base electrode of the transistor 7 is connected via a resistor 18 having a high resistance value to the supply potential. The output of the differential amplifier 4 is connected to the reset input R of the flip flop 16.

A pulse-forming circuit is connected in the input circuit of the flip flop 16. The pulse-forming circuit is of the Eccles-Jordan circuit principle and is a monostable multivibrator. The pulse-forming circuit comprises two transistors 8 and 9, four resistors 10, 11, 12 and 13 and a diode 14. The base electrode of the transistor 8 is connected to the input A of the monostable multivibrator via a resistor 15. The emitter electrodes of both transistors 8 and 9 are at reference or ground potential. The collector electrodes of the transistors 8 and 9 are connected to the positive polarity terminal of the supply voltage via the resistors 11 and 13, respectively.

For the purpose of static feedback, the base electrode of the transistor 8 is connected, via the resistor 10, to the collector electrode of the transistor 9, for the purpose of dynamic feedback, the base electrode of the transistor 9 is connected to the collector electrode of the transistor 8 via the diode 14, and also to the positive polarity terminal of the supply voltage via the resistor 12. The collector electrode of the transistor 9 is connected to the set input S of the flip flop 16.

In the quiescent state, the output Q of the flip flop 16 is at 0. Upon the arrival of a positive pulse at the input A of the monostable multivibrator or pulse-forming circuit, said circuit, as described, operates with noise immunity due to the use of the diode 14, and generates a short pulse for the input S of the flip flop 16. The flip flop 16 is thereby "set" and its set output Q then provides the signal 1. At the same time, the reset output Q provides the signal 0, and thereby cuts off the transistor 1, which in the quiescent state of the flip flop 16 was conducting and had short-circuited the capacitor 2. The capacitor 2 is then charged via the resistor 3. The charging time can be determined accurately through the design of the RC circuit 3,2 comprising the resistor 3 and the capacitor 2.

A voltage according to the dividing ratio of the voltage divider 5, 6 is applied to the second input of the differential amplifier 4. When the voltage across the capacitor 2, that is, the voltage at the first input of the differential amplifier 4, has become equal to that at the other input of said differential amplifier, said differential amplifier resets the flip flop 16 to the quiescent state via the reset input R of said flip flop. The set output Q of the flip flop 16 is then again the signal 0, and the reset output Q of said flip flop is the signal 1. The transistor 1 again becomes again conducting and the capacitor 2 is discharged.

The duration of the pulse at the set output Q of the flip flop 16, and therefore at the output of the monolithic multivibrator is determined by the design of the RC circuit 3,2 and the ohmic or resistive voltage divider 5,6. The dividing ratio of the voltage divider 5,6 can be fixed with rather high accuracy, even in an integrated circuit. The two transistors 1 and 7 are of the same type and manufacturing history. Their residual voltages are thereby nearly equal in the circuit of the invention. In the conducting state of the transistors 1 and 7, both inputs of the differential amplifier 4 are raised by the residual voltage of said transistors in a similar manner. This permits high accuracy of the pulse duration. Manufacturing tolerances and temperature variations are thereby compensated for.

The monolithic multivibrator of my invention is therefore distinguished, especially as an integrated circuit, by universal applicability. It produces largely noise-immune voltage pulses of precisely definable duration, the range of variability of which is extremely wide due to the fact that polarized capacitors may be used for the time-determining RC circuit. The shape of the input pulses is immaterial.

While the invention has been described by means of a specific example and in a specific embodiment, we do not wish to be limited thereto, for obvious modifications will occur to those skilled in the art without departing from the spirit and scope of the invention

I claim:

1. A monolithically integrable monostable multivibrator having a set input, a reset input, a set output and a reset output and comprising a flip flop, a signal at the reset output of the multivibrator being inverted relative to a signal supplied to the set input thereof; a source of reference potential; a source of supply voltage; a timing circuit having an input connected to the reset output of the flip flop and an output, said timing circuit comprising a transistor having a base electrode connected to the reset output of the flip flop, an emitter electrode connected to the source of reference potential and a collector electrode and an RC circuit having a resistor and a capacitor connected in series circuit arrangement with the resistor connected to the source of supply voltage and the capacitor connected to the source of reference potential, the collector electrode of the transistor being connected to a common point in the connection between the resistor and the capacitor; a differential amplifier having a first input connected to the collector electrode of the transistor, an output connected to the reset input of the flip flop and a second input; a resistive voltage divider connected between the source of supply voltage and the source of reference potential and having a tap point connected to the second input of the differential amplifier, the voltage divider comprising a resistor, a transistor having a base electrode connected to the source of supply voltage via the resistor and a collector-emitter path and a pair of resistors connected in series circuit arrangement with the collector-emitter path of the transistor between the source of supply voltage and the source of reference potential, one end of one of the pair of resistors being connected to the source of reference potential through the collector-emitter path of the transistor and one end of the other of the pair of resistors being connected to the source of supply voltage to compensate for the residual voltage of the transistor of the timing circuit; and a pulse-forming monostable multivibrator having an input and an output connected to the set input of the flip flop, the multivibrator comprising a diode, a first transistor having emitter and collector electrodes and a base electrode connected to the input of the multivibrator and a second transistor having an emitter electrode, a base electrode coupled to the collector electrode of the first transistor via the diode to provide dynamic feedback and a collector electrode connected to the set input of the flip flop, the emitter electrodes of the first and second transistors being connected to the source of reference potential.

2. A monolithically integrable monostable multivibrator as claimed in claim 1, wherein the collector electrode of the second transistor of the multivibrator is connected to the base electrode of the first transistor of the multivibrator to provide static feedback.

3. A monolithically integrable monostable multivibrator as claimed in claim 1, wherein the transistor of the timing circuit and the transistor of the voltage divider are identical.

* * * * *